United States Patent
Wheel et al.

(10) Patent No.: US 6,194,908 B1
(45) Date of Patent: Feb. 27, 2001

(54) TEST FIXTURE FOR TESTING BACKPLANES OR POPULATED CIRCUIT BOARDS

(75) Inventors: Kevin M. Wheel, Manchester; John R. Kiely, Hollis, both of NH (US)

(73) Assignee: Delaware Capital Formation, Inc., Wilmington, DE (US)

(*) Notice: Subject to any disclaimer, the term of this patent is extended or adjusted under 35 U.S.C. 154(b) by 0 days.

(21) Appl. No.: 09/207,740

(22) Filed: Dec. 8, 1998

Related U.S. Application Data

(63) Continuation-in-part of application No. 08/883,552, filed on Jun. 26, 1997, now Pat. No. 5,945,838.

(51) Int. Cl.[7] .................................................. G01R 31/02
(52) U.S. Cl. .......................................... 324/761; 324/754
(58) Field of Search ................................ 324/754, 757, 324/761, 758

(56) References Cited

U.S. PATENT DOCUMENTS

| 4,721,908 | 1/1988 | Driller et al. ......................... 324/158 |
| 5,247,246 | 9/1993 | Van Loan et al. ................... 324/158 |
| 5,289,117 | 2/1994 | Van Loan et al. ................... 324/158 |
| 5,389,885 | 2/1995 | Swart .................................... 324/761 |
| 5,394,099 | 2/1995 | Kazama .............................. 324/754 |
| 5,444,387 | 8/1995 | Van Loan et al. ................... 324/754 |
| 5,493,230 | 2/1996 | Swart et al. .......................... 324/754 |
| 5,767,692 | 6/1998 | Antonello et al. .................... 324/761 |
| 5,818,248 | * 10/1998 | St. Onge .............................. 324/761 |
| 5,945,836 | * 8/1999 | Sayre et al. .......................... 324/761 |
| 5,990,696 | * 11/1999 | Swart .................................... 324/761 |
| 6,005,405 | * 12/1999 | Slutz .................................... 324/761 |

FOREIGN PATENT DOCUMENTS

| 58-39574 | 3/1983 | (JP) . |
| 60-163374 | 10/1985 | (JP) . |
| 63-71600 | 5/1988 | (JP) . |
| 4-110978 | 9/1992 | (JP) . |
| 5-215773 | 8/1993 | (JP) . |
| 5-302938 | 11/1993 | (JP) . |
| 6-80179 | 11/1994 | (JP) . |
| 10-19960 | 1/1998 | (JP) . |
| 10-186005 | 7/1998 | (JP) . |

* cited by examiner

Primary Examiner—Glenn W. Brown
(74) Attorney, Agent, or Firm—Christie, Parker & Hale, LLP

(57) ABSTRACT

A test fixture for testing backplanes of a printed circuit board having at least one shrouded connector including a translator fixture having a plurality of spaced apart translator plates adapted for containing and supporting a plurality of translator pins and a probe plate rigidly connected to a top plate of the translator fixture having a plurality of spring probes extending through holes in the probe plate in electrical contact with the translator pins of the translator fixture to translate to signals from the connector to a grid base located below the translator fixture.

17 Claims, 6 Drawing Sheets

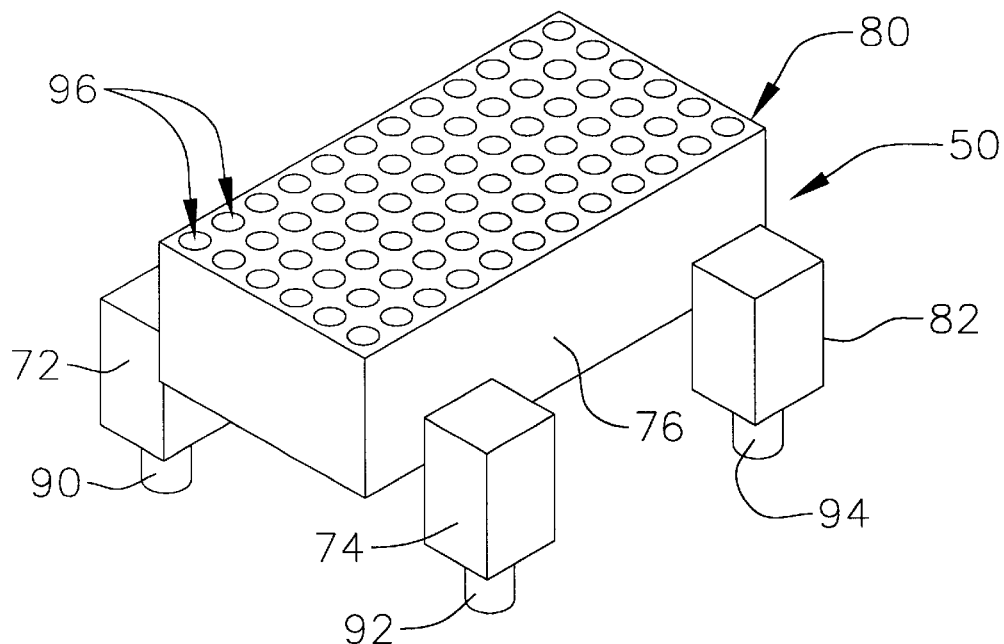
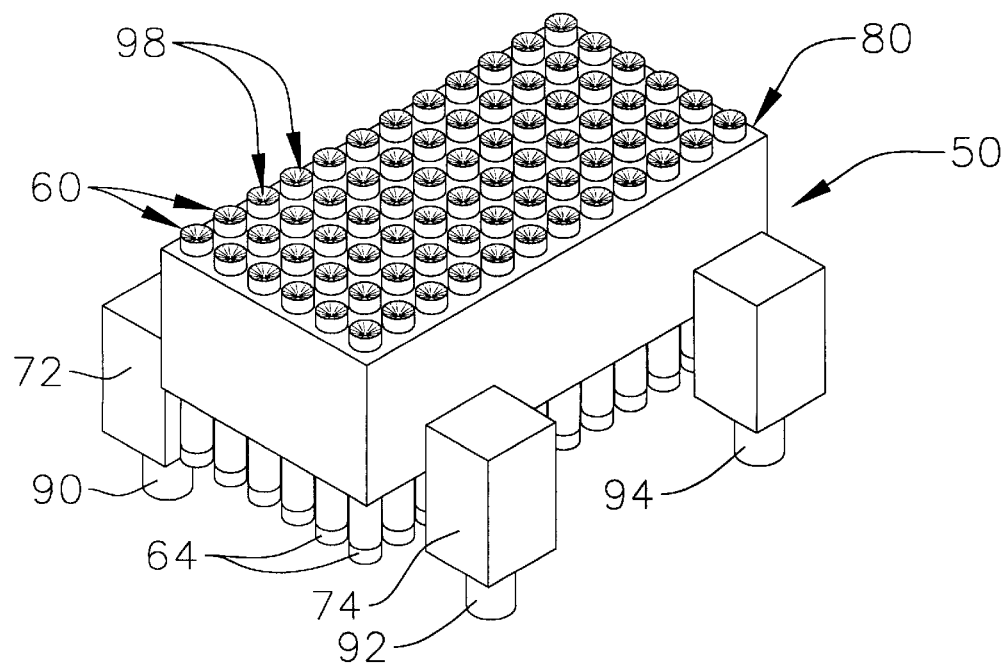

TEST FIXTURE FOR TESTING BACKPLANES OR POPULATED CIRCUIT BOARDS

CROSS REFERENCE TO RELATED APPLICATIONS

This application is a continuation-in-part of U.S. patent application Ser. No. 08/883,552 filed Jun. 26, 1997, now U.S. Pat. No. 5,945,838.

BACKGROUND OF THE INVENTION

The present invention relates to the testing of printed circuit boards. The invention has particular utility in connection with determined test fixtures of the type having test probes on a grid pattern, in which a translator pin fixture is used for translating electrical current from an off-grid pattern on a board under test to the channels of a tester in which the channel contacts are arranged in a grid pattern. An especially particular utility for the present invention is found in the area of facilitating electrical testing of electrical connectors mounted on a circuit board (commonly referred to as "backplane" or "mid-plane"). These connectors typically are surrounded by a sidewall extending beyond the ends of the electrical contact posts. The invention includes a large area probe plate having a plurality of spring probes fastened to the top plate of the translator fixture to provide compliant parallel translation of test signals between the connectors on the backplane and the translator pins of the translator fixture.

BRIEF DESCRIPTION OF RELATED PRIOR ART

Automatic test equipment for checking printed circuit boards has long involved the use of "bed of nails" test fixtures on which the circuit board in mounted during testing. A typical test fixture includes a large number of nail-like test probes arranged to make electrical contact between spring loaded contacts in the test equipment and designated test points on the circuit board under test also referred to as the unit under test or "UUT". Any particular circuit laid out on a printed circuit board is likely to be different from other circuits, and consequently, arrangement of test probes for contacting test points on the board must be customized in a test fixture for that particular circuit board. Board design and fabrication data is used to determine what specific board features are to be tested by the fixture. A "determined" grid test fixture is typically fabricated by drilling patterns of holes in several rigid and non-conducting plates, e.g. of Lexan®, assembling those plates with suitable fasteners and spacers to maintain said plates in a parallel, aligned position and then mounting test pins or probes in the drilled holes. Each plate has a hole pattern which is unique such that the test pin can only be inserted to provide an xy and z translation between a unique feature on the UUT and a unique tester grid channel. The circuit board is then positioned in the fixture precisely aligned with the array of test probes. During testing, the pins in the fixture are brought into spring-pressure contact with the test points on the circuit board under test. Electrical test signals are then transferred between the board and the tester through the fixture so that a high speed electronic test analyzer which detects continuity or lack of continuity between various test points in the circuits on the board can perform the actual test.

Various approaches have been used in the past for bringing the test probes and the circuit board under test into pressure contact for testing. One class of these fixtures is a "wired" test fixture or a "dedicated" test fixture in which the test probes are individually wired to separate interface contacts for use in transmitting test signals from the probes to the external electronically controlled test analyzer. These wired test fixtures are often referred to as "vacuum test fixtures" since a vacuum is applied to the interior of the test fixture housing during testing to compress the circuit board into contact with the test probes. Customized wired test fixtures of similar construction also can be made by using mechanical means other than vacuum to apply the spring force necessary for compressing the board into contact with the probes during testing.

One method traditionally used to connect the electronic channels of a tester to a backplane of a unit under test, is the dedicated fixture which consists of a collection of spring loaded contacts arranged in a drilled probe plate to match the pattern of test points on the unit under test. The spring probes are wired to transfer points or connectors which plug in, or otherwise make contact to, the channels of the tester. An advantage of a dedicated test fixture is it permits testing of non-uniform patterns of contacts, including different height contacts by using varying length spring probes. Dedicated testers can be configured to have an appropriate number of channels for the type of product to be tested so that the channels are generally used quite efficiently. There are a number of disadvantages, however, to dedicated testers, the most notable of which is cost. The complexity of wiring dedicated fixtures, together with the relatively high material cost of spring loaded contacts makes the dedicated arrangement extremely expensive for large, high point count backplanes. Testing a backplane for opens and shorts requires that all nodes of every net be contacted. This is in contrast to dedicated fixtures for (loaded board test), and also known as in-circuit or functional testing, which requires only one test point per net. A backplane might have ten thousand test points for opens and shorts testing, and only one thousand nets. Further, revision changes in the unit under test cannot be easily accommodated and the serviceability and reliability of dedicated fixtures is somewhat lower than determined translator grid fixtures.

A further class of test fixtures is the so-called "grid-type fixture" test fixture, also known as a "determined" fixture, in which the random pattern of test points on the board are contacted by translator pins which transfer test signals to spring loaded interface pins arranged in a grid pattern in the tester. In these grid-type testers, fixturing is generally less complex and can be produced at a lower cost than in the customized wired test fixtures; but with a grid system, the grid interfaces and test electronics are substantially more complex and costly.

A typical grid tester may have thousands of switches and channels. Each channel may have several switches, and is addressable and serves as one coordinate in the "grid". The tester usually has spring-loaded contacts which comprise the grid. The fixture usually contains rigid translator pins which conduct current from the grid channels to the UUT. In this way, the tester's computer can be made to test continuity and isolation in the UUT through the fixture. When testing a bare board on such a tester, a translator fixture supports and guides rigid pins that conduct between a grid pattern of spring-loaded probes in a grid base and an off-grid pattern of test points on the board under test. In one prior art grid fixture so-called "tilt pins" are used as the translator pins. The tilt pins are straight solid pins mounted in corresponding pre-drilled holes in translator plates which are part of the translator fixture. The tilt pins can tilt in various orientations to translate separate test signals from the off-grid random pattern of test points on the board to the grid pattern of test probes in the grid base.

Determined fixtures, also known as translator fixtures for a universal grid tester, offer a lower cost alternative which is suitable for many backplane testing requirements. Translator fixtures, however, are less commonly used for testing backplanes than dedicated fixtures mainly because the software requirements are unique and beyond the capabilities of general purpose test fixture software. Translator fixtures usually employ rigid pins, often with a cup-shaped tip, for testing backplanes. Translator fixtures usually rely on the spring loaded contact of the grid to provide the contact force needed for a reliable electrical connection. As a result, any difference in the contact height on the unit under test, must be matched by a corresponding lengthening or shortening of the rigid pin contact between the grid and the unit under test.

Translator fixtures offer a number of advantages when they can be employed for testing backplanes. Given the much lower labor content of assembly and lower cost of component parts, translator fixtures can be manufactured for 20 to 40% of the cost of a comparable dedicated test fixture. They also tend to be lighter in weight and require less maintenance. Translator fixtures, however, suffer from a few disadvantages when compared to dedicated fixtures. By their nature, grid based fixtures usually suffer from low tester channel utilization. Normally, a significant number of unused channels in a grid base exist. They also suffer from two additional problems wherein leaning translator pins cannot always reach up into shrouded connectors, and translator fixtures with multiple pin heights are difficult to design and assemble requiring many custom parts and significant engineering attention. Additionally, the software used to generate the drill files for the fixture must be reconfigured for each board design.

Further details of prior art fixtures are found, for example, in U.S. Pat. No. 5,493,230 and U.S. Pat. No. 4,721,908.

It has been found that prior art testing apparatus of the types discussed above are not well suited for testing of contact posts mounted in connectors having sidewalls which extend beyond the ends of the contact posts. As a result, it often proved difficult to achieve good, stable electrical connection between the contact posts and the translator pins using prior art fixtures. Additionally, due to the tilting required to make contact to the uniform grid of the tester, the translator pins are rarely coaxial with the contact posts when they contact the posts. Since the contact posts usually are spaced very close together in the connector, this can cause translator pins to inadvertently become electrically connected to the wrong contact posts, and/or to each other. These can result in erroneous test results, damage to the circuit board, and/or damage to the testing apparatus. Moreover, with prior art fixtures, it was necessary to drill numerous layers of Lexan® to support and guide the rigid test probes to the level of the contact tips. Additionally, it was necessary to provide clearance slots on either side of the drilled holes for the connector side walls. While such techniques were able somewhat to reduce the risk of occurrences of inadvertent connection of translator pins to wrong contact posts, each other, and the sidewalls of the connectors, such drilling compromised the rigidity of the structure laterally, and often resulted in false opens and shorts during the testing process. Additionally, such techniques added to costs.

It is therefore an object of the present invention to provide a system for use in testing of printed circuit boards which overcomes the aforesaid and other objects of the present invention.

A more specific object of the invention is to provide an improved test fixture assembly particularly for testing backplanes having contact posts mounted in connectors having side walls that extend beyond the tips of the contact posts or other populated circuit board configurations.

Another object of the invention is to provide a test fixture for testing interconnect substrates, substrates for mounting integrated circuits or integrated circuit interposers.

SUMMARY OF THE INVENTION

In accordance with the present invention, a system is provided for electrically testing a connector having contact posts (i.e., connector pins) partially surrounded by a sidewall defining an opening adjacent the tips or ends of the posts. In one embodiment the present invention comprises a test fixture having a plurality of spaced apart translator plates and having holes aligned in the plates for containing and supporting translator pins in a grid pattern. A guide block assembly comprising a plurality of slidably mounted conductive pins is located on the top plate of the test fixture, with the tips or ends of its conductive pins aligned with the tips or ends of the translator pins of the fixture. The guide block is fixedly located on the test fixture by mechanical means such as by posts which are press-fitted into mating holes in the top plate of the fixture. The guide block conductive pins are of one piece, and the opposite ends of which terminate in concave shapes for mating with the tips of the fixture translator pins and with the tips of the contact pins, respectively.

Since in the present invention the guide block conductive pins engage the translator pins and contact posts and are generally coaxially aligned with the contact posts, better and more stable electrical contact may be maintained between the translator pins and contact posts than is possible in the prior art. Additionally, the present invention substantially eliminates the risk of inadvertent connection of translator pins to wrong contact posts, each other, and the sidewalls of the connectors. Further advantageously, the present invention eliminates the need to use the translator pin routing and guiding structures of the prior art, thereby eliminating the expense and time associated with construction and utilization of such structures.

In a second and most preferred embodiment of the present invention, a large area probe plate is physically fastened to a translator fixture. In this embodiment, the large area probe plate is substituted for the guide block assembly of the first embodiment. The large area probe plate can employ a variety of length and force spring probes to reach up into connectors on the backplane and can have additional routed clearance plates for obstructions on the backplane. The large area probe plate is customized to fit the backplane of the unit under test which allows the translator fixture to be all one level and free from design complexity. Contact of the spring probes contained within the large area probe plate against the unit under test is parallel and perpendicular to the probe plate.

BRIEF DESCRIPTION OF THE DRAWINGS

These and other features and advantages of the present invention will become apparent as the following Detailed Description proceeds and upon reference to the Drawings, wherein like numerals depict like parts, and wherein:

FIG. 2 is a top elevational view of the guide block element of FIG. 1, and in which view the conductive pins of the guide block have been removed for clarity;

FIG. 3 is a top elevational view similar to FIG. 2, and showing the inclusion of conductive pins in the guide block element;

DETAILED DESCRIPTION OF PREFERRED EMBODIMENT

Figure 1:
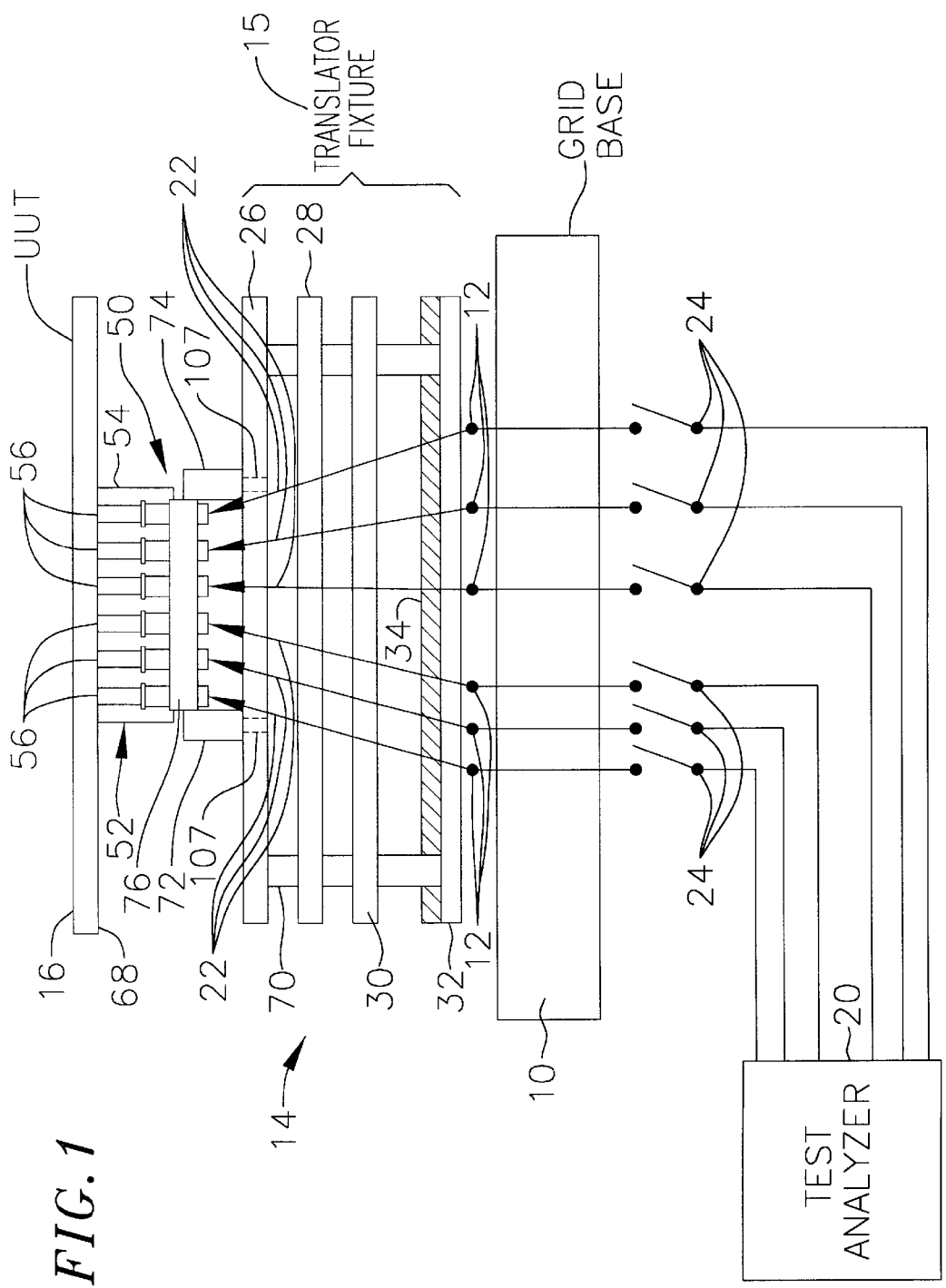
FIG. 1 is a schematic cross-sectional view of a first embodiment of a guide block/test fixture system in accordance with the present invention.
Figure 4:
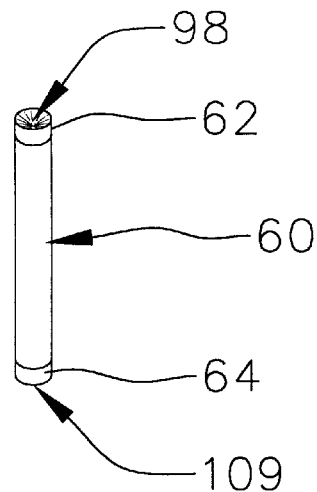
FIG. 4 is a side elevational view of one conductive pin of the guide block element of FIG. 1.

Referring to FIGS. 1–6, a first embodiment 14 of the system of the present invention includes a grid base 10 having an array of spring-loaded test probes 12 arranged on a two-dimensional grid pattern. The test probes illustrated schematically in FIG. 1 preferably comprise an orthogonal array of uniformly spaced-apart rows and columns of test probes which may be aligned on 100 mil centers as an example. The spring-loaded plungers of the test probes 12 may project above or lie just below the top surface of the grid base uniformly across the array of probes. A translator fixture 15 supports a conventional printed circuit board 16 under test (also referred to as a "unit under test" or "UUT") having a backplane connector 52 mounted thereon. The UUT referenced herein, is most commonly a backplane or mid-plane, or a printed circuit board with connectors which serves as an interconnect substrate for either electrical components or assemblies, usually smaller printed circuits. Although backplane test is the principle application for the invention, the invention could be used for any test application which requires translation of a non-uniform pattern of shrouded contacts to a grid array of test channels. It could be applied to testing components and interconnect substrates with testable contacts within a cavity or recess within the substrate. As will be described more fully below, the translator fixture 15 serves as an interface between the posts 56 of the connector 52 of the board 16 under test and the test probes 12 in the grid base 10. Backplanes employ a variety of connectors into which plug the electronic assemblies which comprise a system. Most commonly used connectors have non-conductive shrouds, usually plastic, to align the mating connector and prevent damage to the relatively fragile electrical contact pins which are pressed or soldered into the substrate. An external electronic test analyzer 20 is electrically connected to the posts 56 of the board under test through test probes 22 (of which there may be several types) in the translator fixture 15 which in turn is connected to grid base 10, the translator fixture, and the guide block assembly 50, in a manner that will be described more fully below.

Connector 52 comprises a plurality of electrically conductive elongate contact posts (collectively referred to by numeral 56) mounted to one side 68 of the board 16 and may be connected to various components (not shown) of the board 16 by e.g. conductive traces (not shown). Posts 56 extend normally from the surface 68 toward the outermost translator plate 26 of the translator fixture 15, and are partially surrounded by a shield sidewall 54 which is mounted to the side 68 of the board 16 to which the posts 56 are mounted. Sidewall 54 typically consists of a molded plastic insulator ground shield which defines an opening 120 adjacent the outer rows of posts 56, and extends from the surface 68 of the board 16 to a point beyond the distal ends o the posts 56.

The test analyzer 20 contains electronic interrogation circuits to electronically interrogate (stimulate) the posts 56 of the connector 52 of the board 16 under test in order to determine whether the board 16 and/or connector 52 are operating properly. The electrical response signals produced as a result of such interrogation are compared to stored reference results obtained from simulation of board response and/or testing of a faultless master board or from an electronic database known as a "netlist". If the response signals and reference results match it is assumed that the UUT and/or connector 52 are good.

Electronic interrogation circuits in this embodiment may comprise a plurality of printed circuit cards (sometimes called "switch cards") having electronic components and printed circuits for carrying out the electronic testing. Each test probe used in the test procedure is represented as being coupled to the test electronics through a corresponding switch 24 leading to the analyzer 20. It should be understood that although only six such switches 24 are shown in FIG. 1, any number of switches may be used without departing from this embodiment of the present invention, depending upon the number of posts 56 and other testing points of the board 16 under test.

Translator fixture 15 includes a series of vertically spaced-apart and parallel translator plates 26, 28, 30, 32, which may include a top (outermost) plate 26, an upper plate 28 spaced a short distance below the top plate 26, one or more intermediate plates 30, and a grid facing plate 32 at the bottom of the translator fixture. The translator plates are supported in parallel, vertically spaced apart positions by rigid posts 70 that hold the fixture 15 together as a rigid unit. The fixture 15 also includes an array of standard translator pins such as tilt pins represented schematically at 22 extending through holes (not shown) in the translator plates. FIG. 1 represents only six translator pins for simplicity, but it should be understood that any number of such translator pins 22 may be used depending upon the number of posts 56 and other contact points (not shown) to be tested on the board 16. The tilt pins extending through the base plate 32 of the fixture 15 are in alignment with the grid pattern of test probes 12 in the grid base 10. The top portions of the tilt pins extend through the outermost plate 26 for contacting and being engaged by desired ones of the conductive pins (collectively referred to by numeral 60) of the guide block assembly 50. Preferably, the tilt pins 22 are straight, solid conductive pins, and extend through a pin retaining means 34. Preferably, retaining means comprises a plastic screen of the type disclosed in the copending application Ser. No. 08/662,671 entitled "Retention Of Test Probes In Translator Fixture", filed on Jun. 14, 1996 and assigned to the Assignee of the instant application (which copending application is incorporated herein by reference), although if embodiment 14 is appropriately modified, other types of translator pin retaining means may be used without departing from the present invention. As disclosed in said copending application, the plastic screen retaining means 34 preferably is located between the lower most plates 30, 32 of the translator fixture 15, and includes a multiplicity of interstitial openings which provide for penetration for the translator pins 22. The plastic properties of said plastic screen retaining means 34 apply a partial compression force around the circumference of the translator pins 22 sufficient to retain the translator pins within the test fixture 15. Other methods for translator pin retention can also be used such as latex sheets.

The translator fixture provides electrical contract between the array of tester channels arranged in the uniform and regular grid pattern with a non-uniform arrangement of testable points on the unit under test. More specifics regarding a translator fixture can be found in U.S. Pat. No. 5,729,146, the disclosure of which is incorporated herein by reference.

Figure 5:
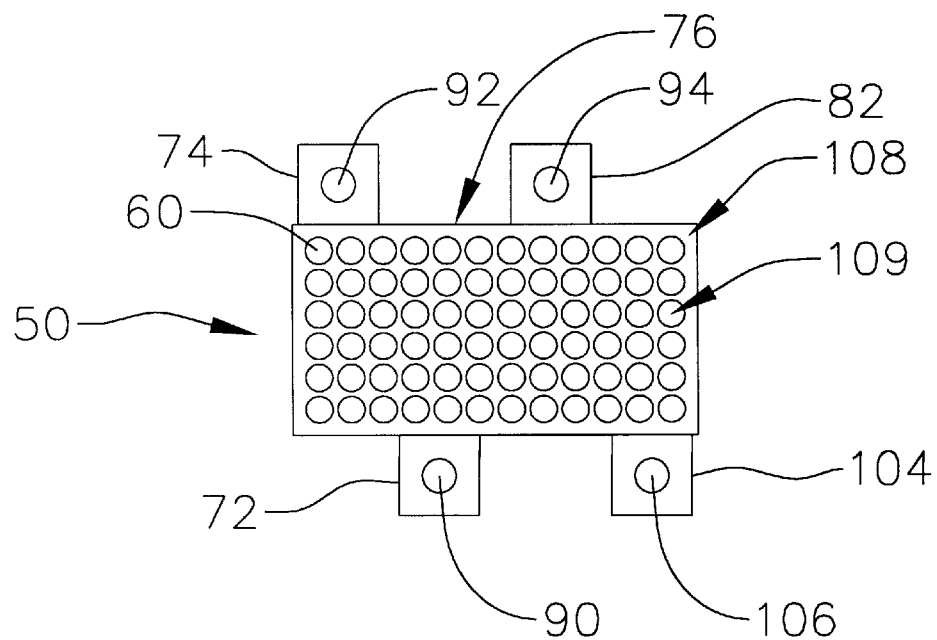
FIG. 5 is a bottom plan view of the guide block element of FIG. 3.
Figure 6:
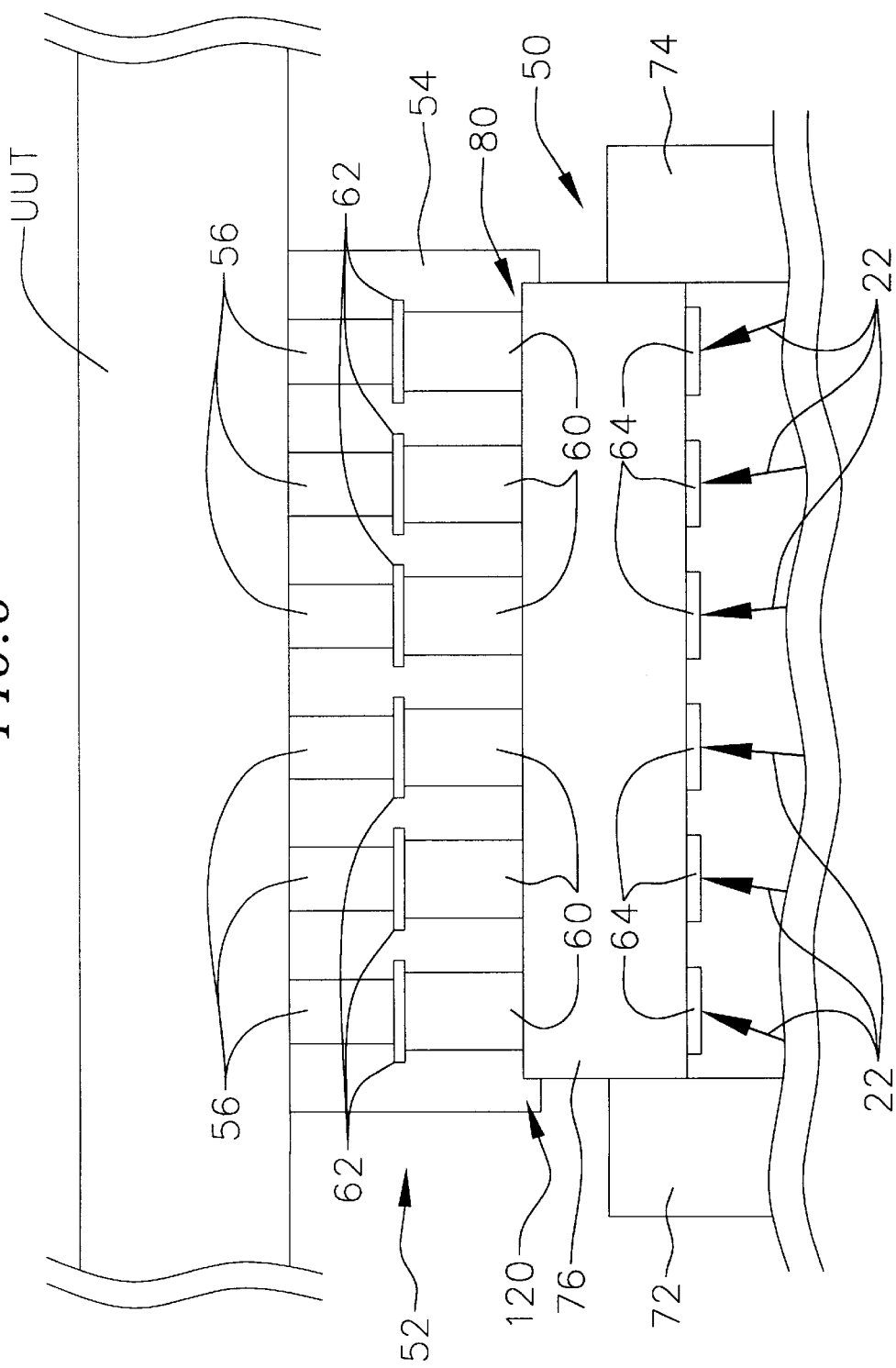
FIG. 6 is an enlargement of a portion of the schematic diagram of FIG. 1.

Completing the system of the first embodiment is a guide block 50 which is positioned directly beneath the distal ends of the posts 56 and which, in preferred form, comprises a rectangular, molded or machined plastic block 76 having a top surface plan 80 which is undersized compared to the opening 120 of the connector 52. Thus, the guide block is dimensioned to be inserted within the opening 120 so as to permit the surface 80 to be spaced close enough to the posts 56 to permit the pins 60 to contact and engage the distal ends of the posts 56 when pins 60 are extended, at least in part to the "up" position, i.e. as shown in FIG. 6. Block 76 also includes integrally formed rectangular legs 72, 74, 82, 104, which legs 72, 74, 82, 104 include respective cylindrical portions 90, 92, 94, 106 for mounting into matching holes (shown in phantom at 107) formed in the outermost plate 26 of the fixture to removably affix the guide block 76 to the outermost plate 26. As seen in FIGS. 2 and 5, legs 72, 74, 82, 104 are staggered so as to permit the guide blocks to be mounted close to one another.

A plurality of cylindrical, electrically conductive pins 60 (comprising an electrically conductive, machinable metal, e.g. gold plated beryllium-copper or half-hard brass) are slidably mounted in respective cylindrical holes (collectively referred to by numeral 96). Preferably, pins 60 are longer than the holes 96 by about 150–170 mils, and each of the pins 60 comprises opposing top 62 and bottom 64 ends which are slightly oversized compared to the holes 96 and central portions 102 in-between the ends 62 and 64, so as to permit the pins 60 to slide in the holes 96 while preventing them from falling out of the holes 96. Preferably, in this embodiment, pins 60 comprise one piece pins, the ends 62, 64 have maximum diameters of 1.524 mm, while the central portions 102 have diameters of 1.372 mm. Preferably, but not necessarily, ends 62, 64 are tapered to 1.372 mm. Pins 60 are loaded into the block 76 by force fitting. Alternatively, pins 60 may comprise two piece pins in which case, the pins may be loaded into the block 76 from opposite sides, and then mated together. Each of the pins 60 also comprises top 98 and bottom 109 concavities (i.e., concave surfaces). Concavities 98, 109 are adapted (i.e., have appropriate dimensions and shapes) to engage and mate with the distal ends of the contact posts 56 and the top portions of the translator pins 22, respectively. Also, preferably, the number and configuration of pins 60 match the number and configuration of the posts 56 desired to be tested by the apparatus. The dimensions, shapes, orientations, configuration and pin count of the guide block assembly may be varied, i.e. to accommodate different connectors to be tested.

In use, the guide assembly 50 is press fitted, in position, on the top plate 26 of the test fixture. The board to be tested is then positioned in the tester, adjacent the testing fixture. The top portions of the translator pins 22 contact with and engage the bottom concavities 109 or the conductive pins 60. Compressive force is applied to the pins 60 by the spring-loaded probes 12 via the translator pins 22 which causes the pins 60 to slide upwardly in the holes 96 such that the top portions 62 of the pins 60 extend about 150–170 mils above the top surface portion 80 of the guide assembly 76 positioned inside the opening 120 of the connector 52, and concavities 98 of the pins 60 contact and engage the distal ends of the contact posts 56. When in contact with the posts 56, each of the pins 60 is substantially coaxial with and mates with a respective one of the contact posts 56. Electrical test signals and responses may then be transmitted between the contact posts 56 and the analyzer 20 via the switches 24, test probes 12, translator pins 22, and guide block pins 60 of the apparatus. Although embodiment 14 has been described as comprising specific types of test fixtures (i.e., test analyzer 20, switches 24, grid base 10, and translator fixture 15 comprising a plurality of spaced apart translator plates), if appropriately modified, embodiment 14 may utilize other types and configurations of test fixtures without departing from the present invention. Other modifications are also possible. For example, although guide block pins 60 have been described as all having the same lengths and diameters, if posts 56 have different lengths from each other, the apparatus may be modified such that pins 60 have different lengths from each other so as to permit pins 60 to contact and engage the distal ends of the posts 56 when force is applied to the pins 60 by the translator pins 22 in the manner discussed previously. The invention also advantageously may be employed in connection with testing of other prefigured components and/or for in-circuit testing.

Figure 7:
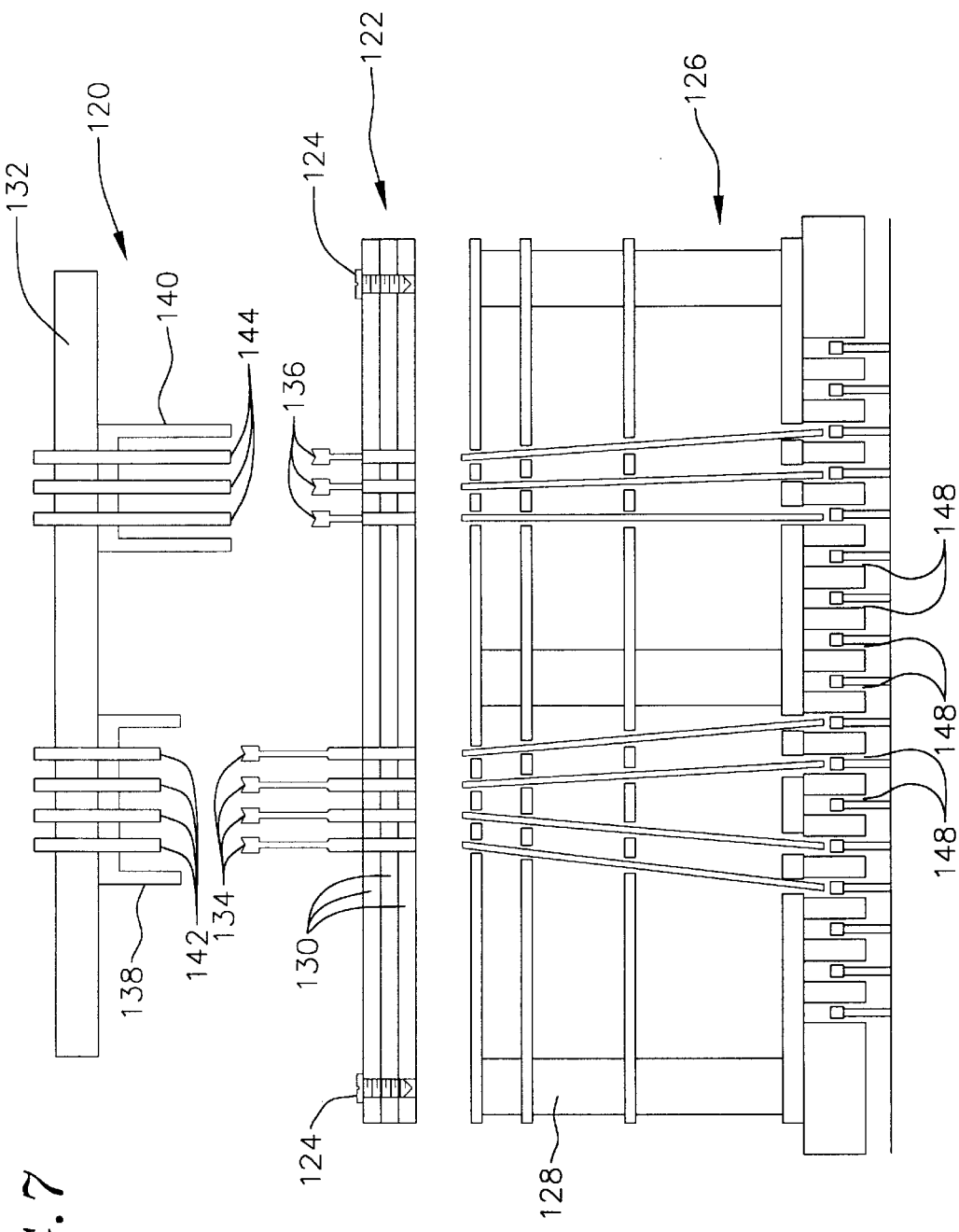
FIG. 7 is a schematic exploded cross-sectional view of an alternative and preferred embodiment test fixture.

A preferred embodiment test fixture 120 can be seen in FIG. 7. The test fixture includes a large area probe plate 122 which is physically fastened by screws 124 or other suitable fastening means to the translator fixture 126. Typically, screws pass through the probe plate 122 and into stand offs 128 of the translator fixture 126. Probe plate 122 consists of a plurality of thinner plates 130 which are stacked and aligned on top of each other to form probe plate 122. Any number of plates 130 can be used depending upon the height requirements for the backplane or unit under test 132 to be tested. Although FIGS. 7 and 8 illustrate a printed circuit board or backplane with shrouded connectors, it is to be understood that the test fixture of the present invention is equally suitable for testing other types of interconnect substrates or substrates for mounting integrated circuits or integrated circuit interposers commonly known in the art.

Probe plate 122 has a plurality of rows and columns of holes drilled through the plates 130 to accommodate spring probes 134 and 136. The probe plate 122 can accommodate a variety of length and force spring probes to reach up into the connectors 138 and 140 to make contact with the connector pins 142 and 144 of the connectors. Although spring probes are shown in probe plate 122 it is to be understood that other types of test probes can be used such as straight solid probes. As shown in FIG. 8 the probe plate can have additional customized smaller plates 146 positioned on the probe plate 122 for routed clearances for obstructions on the backplane 132. The exact size and configuration of plates 146 depend upon the particular configuration and connectors on the backplane. Plates 146 are attached to probe plate 122 by the receptacles of the spring probes 134 which serve to align and connect plates 146 to probe plate 122.

Figure 8:
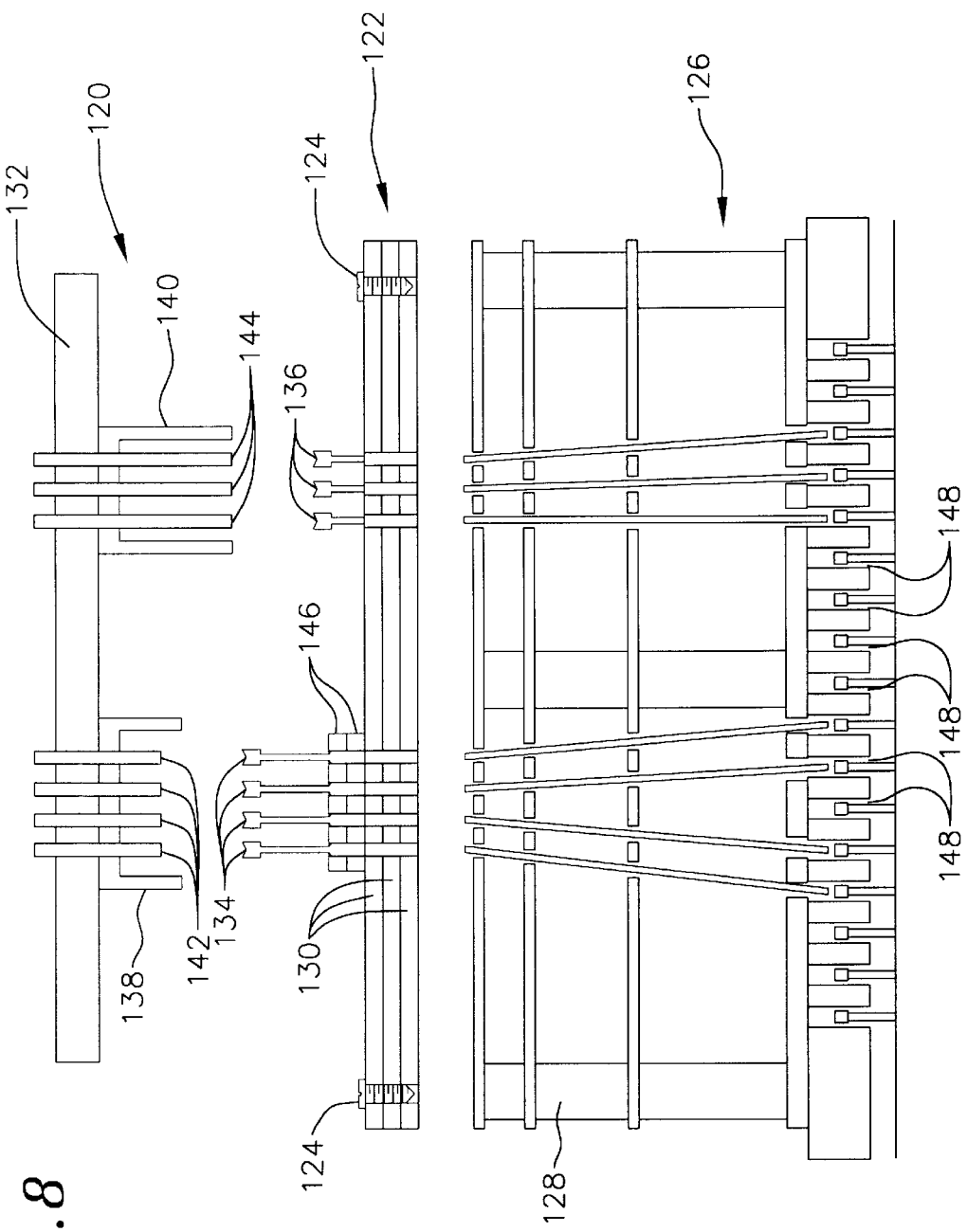
FIG. 8 is a schematic exploded cross-sectional view of a second alternative embodiment test fixture of the present invention.

It is the probe plate 122 and routed clearance plates 146 of fixtures 120 shown in FIGS. 7 and 8 that are customized to fit the unit under test which allows the translator fixture 126 to be all one level and free from design complexity. The contact of the spring probes 134 and 136 against the backplane 132 are parallel to each other and perpendicular to the probe plate. The advantages created by the test fixtures of FIGS. 7 and 8 is that it can incorporate any standard translator fixture which minimizes assembly, material and engineering costs and provides for simple translation of UUT test point locations in x–y space to the x–y coordinates of the grid channels 148. Test fixture 120 eliminates the need for wiring test probes and maintainability and servicing of the fixture is much easier than a traditional dedicated fixture since the probe plate can easily be separated from the translator fixture providing access to all fixture components. Reworking of the test fixture 120 is also much simpler without a nest of wires on the backside of the fixture. The test fixtures 120 allow for grid testers to be used in testing backplanes, where dedicated fixtures were required in the past. Another advantage is that the spring probes in probe plate 122 do not apply a side load to the connector pins 142 and 144 which is becoming increasingly important as connectors and their pins shrink to fit into even smaller electronic assemblies. Probe plate 122 also provides a stable platform for withstanding and transferring compression forces during testing.

Further modifications are also possible. Thus, the present invention should not be viewed as being limited to only the specific embodiments and methods of use hereinbefore set forth, but rather, should be viewed as being of broad scope as only defined as set forth in the hereinafter appended claims.

What is claimed is:

1. A test fixture for testing an interconnect substrate having at least one shrouded connector comprising:
   a translator fixture having a plurality of spaced apart translator plates adapted for containing and supporting a plurality of translator pins;
   a probe plate rigidly connected to a top plate of the translator fixture, the probe plate having a plurality of test probes located in holes extending through the probe plate; and
   at least one routed clearance probe plate positioned on an upper surface of the probe plate to guide the test probes into the shrouded connector, the test probes being in electrical contact with the translator pins to translate test signals from the shrouded connector on the interconnect substrate to a grid base located below the translator fixture.

2. The test fixture of claim 1 wherein the test probes are spring probes of varying heights.

3. The test fixture of claim 1 wherein the probe plate comprises a plurality of individual thin probe plates stacked upon each other.

4. The test fixture of claim 1 wherein the translator pins and the test probes are straight solid pins.

5. The translator fixture of claim 4 wherein a portion of the translator pins are tilted at an angle through the translator plates.

6. The test fixture of claim 1 wherein the test probes are parallel to one another and perpendicular to the probe plate.

7. A test fixture for a populated circuit board having at least one shrouded component attached to the circuit board comprising:
   a translator fixture having a plurality of spaced apart translator plates adapted for containing and supporting a plurality of translator pins;
   a probe plate rigidly connected on an upper surface of the translator fixture having a plurality of test probes located in rows and columns of holes extending through the probe plate and in electrical contact with the translator pins to translate test signals from the at least one shrouded component on the circuit board through the translator fixture; and
   at least one routed clearance probe plate positioned on the probe plate to guide the test probes into the at least one shrouded component.

8. The test fixture of claim 7 wherein the test probes are spring probes of varying heights.

9. The test fixture of claim 7 wherein the probe plate comprises a plurality of individual thin probe plates stacked upon each other.

10. The test fixture of claim 7 wherein the test probes and the translator pins are straight solid pins.

11. The translator fixture of claim 10 wherein a portion of the translator pins are tilted at an angle through the translator plates.

12. The test fixture of claim 7 wherein the test probes are parallel to one another and perpendicular to the probe plate.

13. A test fixture for testing backplanes of a printed circuit board having a plurality of shrouded connectors comprising:
   a translator fixture having a plurality of spaced apart translator plates adapted for containing and supporting a plurality of translator pins:
   a probe plate rigidly connected to a top plate of the translator fixture;
   the probe plate includes at least one routed clearance probe plate positioned on an upper surface of the probe plate;
   a first plurality of spring probes positioned in holes extending through the probe plate and in electrical contact with the translator pins; and
   a grid base positioned below the translator fixture having a second plurality of spring probes in electrical contact with the translator pins.

14. The test fixture of claim 13 wherein the first plurality of spring probes are of varying heights.

15. The test fixture of claim 13 wherein the probe plate comprises a plurality of thin probe plates stacked upon each other.

16. The translator fixture of claim 15 wherein a portion of the translator pins are tilted at an angle through the translator plates.

17. The test fixture of claim 13 wherein the first plurality of spring probes are parallel to one another and perpendicular to the probe plate.

* * * * *